(12) United States Patent
Kondo

(10) Patent No.: US 10,930,338 B2
(45) Date of Patent: *Feb. 23, 2021

(54) SEMICONDUCTOR DEVICE HAVING PDA FUNCTION

(71) Applicant: LONGITUDE LICENSING LIMITED, Dublin (IE)

(72) Inventor: Chikara Kondo, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/818,425

(22) Filed: Mar. 13, 2020

(65) Prior Publication Data

US 2020/0219554 A1 Jul. 9, 2020

Related U.S. Application Data

(63) Continuation of application No. 16/117,677, filed on Aug. 30, 2018, now Pat. No. 10,593,394, which is a
(Continued)

(30) Foreign Application Priority Data

Sep. 28, 2011 (JP) ................. 2011-212141

(51) Int. Cl.
| | |
|---|---|
| *G11C 7/00* | (2006.01) |
| *G11C 11/4093* | (2006.01) |
| *G06F 13/16* | (2006.01) |
| *G11C 7/10* | (2006.01) |
| *G11C 7/22* | (2006.01) |
| *G11C 11/4072* | (2006.01) |

(Continued)

(52) U.S. Cl.
CPC ........ *G11C 11/4093* (2013.01); *G06F 13/161* (2013.01); *G11C 7/109* (2013.01); *G11C 7/1045* (2013.01); *G11C 7/1093* (2013.01); *G11C 7/222* (2013.01); *G11C 11/4063* (2013.01); *G11C 11/4072* (2013.01); *G11C 11/4076* (2013.01); *G11C 11/4087* (2013.01); *G11C 11/4096* (2013.01); *Y02D 10/00* (2018.01)

(58) Field of Classification Search
CPC ..................................................... G11C 7/109
USPC ........................................................ 365/191
See application file for complete search history.

(56) References Cited

U.S. PATENT DOCUMENTS

| | | | |
|---|---|---|---|
| 6,021,264 A | 2/2000 | Morita | |
| 6,483,769 B2 | 11/2002 | La | |

(Continued)

FOREIGN PATENT DOCUMENTS

| | | |
|---|---|---|
| JP | 2002133866 A | 5/2002 |
| JP | 2008060641 A | 3/2008 |

(Continued)

*Primary Examiner* — Hoai V Ho
(74) *Attorney, Agent, or Firm* — Kunzler Bean & Adamson

(57) ABSTRACT

A method for writing a mode register in a semiconductor device, the method includes receiving a mode register command and a mode signal; generating a first mode register setting signal; delaying the first mode register setting signal in a first latency shifter to provide a second mode register setting signal; receiving a data signal in synchronization with the second mode register setting signal; and writing the mode signal to the mode register only if the received data signal has a first logic level.

14 Claims, 11 Drawing Sheets

Related U.S. Application Data continuation of application No. 15/624,511, filed on Jun. 15, 2017, now Pat. No. 10,068,637, which is a continuation of application No. 15/271,872, filed on Sep. 21, 2016, now Pat. No. 9,715,921, which is a continuation of application No. 14/659,757, filed on Mar. 17, 2015, now Pat. No. 9,466,343, which is a continuation of application No. 14/255,698, filed on Apr. 17, 2014, now Pat. No. 9,087,560, which is a continuation of application No. 13/618,754, filed on Sep. 14, 2012, now Pat. No. 8,737,143.

(51) Int. Cl.
*G11C 11/4076* (2006.01)
*G11C 11/408* (2006.01)
*G11C 11/4096* (2006.01)
*G11C 11/4063* (2006.01)

(56) References Cited

U.S. PATENT DOCUMENTS

| | | | |
|---|---|---|---|
| 6,804,165 B2 | 10/2004 | Schrögmeier et al. | |
| 7,330,382 B2 | 4/2008 | Schaefer | |
| 7,612,579 B2 | 11/2009 | Fujisawa | |
| 8,068,383 B2 | 11/2011 | Lee | |
| 8,737,143 B2 * | 5/2014 | Kondo | G11C 11/4096 |
| | | | 365/189.12 |
| 9,087,560 B2 | 7/2015 | Kondo | |
| 9,715,921 B2 | 7/2017 | Kondo | |
| 10,068,637 B2 | 9/2018 | Kondo | |
| 2002/0048197 A1 | 4/2002 | La | |
| 2003/0067812 A1 | 4/2003 | Kajimoto | |
| 2005/0007835 A1 | 1/2005 | Lee et al. | |
| 2008/0054936 A1 | 3/2008 | Fujisawa | |
| 2008/0123452 A1 | 5/2008 | Kim | |
| 2009/0231947 A1 | 9/2009 | Lee | |
| 2010/0223514 A1 | 9/2010 | Nara et al. | |
| 2011/0055509 A1 | 3/2011 | Ware et al. | |
| 2011/0205832 A1 | 8/2011 | Jeon | |

FOREIGN PATENT DOCUMENTS

| | | |
|---|---|---|
| JP | 2009217926 A | 9/2009 |
| JP | 2011154771 A | 8/2011 |

* cited by examiner

| CS | CMD | | | | ICMD |
|---|---|---|---|---|---|
| | ACT | RAS | CAS | WE | |
| 0 | X | X | X | X | DESEL |
| 1 | 0 | 0 | 0 | 0 | NOP |
| 1 | 1 | 0 | 0 | 0 | IACT |
| 1 | 0 | 1 | 0 | 1 | IPRE |
| 1 | 0 | 0 | 1 | 1 | IWR1 |
| 1 | 0 | 0 | 1 | 0 | IRD1 |
| 1 | 0 | 1 | 1 | 1 | MRS1 |

FIG.2

SEMICONDUCTOR DEVICE HAVING PDA FUNCTION

The present application is a Continuation application of U.S. patent application Ser. No. 16/117,677 filed on Aug. 30, 2018, which is a Continuation application of U.S. patent application Ser. No. 15/624,511 filed on Jun. 15, 2017, now U.S. Pat. No. 10,068,637 issued on Sep. 4, 2018, which is a Continuation application of U.S. patent application Ser. No. 15/271,872 filed on Sep. 21, 2016, now U.S. Pat. No. 9,715,921 issued on Jul. 25, 2017, which is a Continuation application of U.S. patent application Ser. No. 14/659,757 filed on Mar. 17, 2015, now U.S. Pat. No. 9,466,343 issue on Oct. 11, 2016, which is a Continuation application of U.S. patent application Ser. No. 14/255,698 filed on Apr. 17, 2014, now U.S. Pat. No. 9,087,560 issue on Jul. 21, 2015, which is a Continuation application of U.S. patent application Ser. No. 13/618,754 filed on Sep. 14, 2012, now U.S. Pat. No. 8,737,143 issued on May 27, 2014, which is based on and claims priority from Japanese Patent Application No. 2011-212141, filed on Sep. 28, 2011, the entire contents of which is incorporated herein by reference.

BACKGROUND OF THE INVENTION

1. Field of the Invention

The present invention relates to a semiconductor device 10 and an information processing system including the same, and more particularly to a semiconductor device including a mode register for setting an operation mode and the like and an information processing system including the same.

2. Description of Related Art

Some semiconductor memory devices, typified by a DRAM (Dynamic Random Access Memory), include a mode register for setting their operation mode (see Japanese Patent Application Laid-Open No. 2002-133866). Operation modes to be set in the mode register may include the values of an additive latency (AL), a CAS latency (CL), and a CAS write latency (CWL), and the impedances of output buffers (see Japanese Patent Application Laid-Open Nos. 2008-60641 and 2009-217926).

DDR4 (Double Data Rate 4) DRAMs have recently been proposed as DRAMs even faster than DDR3 (Double Data Rate 3) DRAMs. DDR4 DRAMs support a new function called "PDA". The FDA function provides a latency for the rewriting of the mode register and makes it possible to set the mode registers of DRAM chips to respective different values.

A circuit for implementing the PDA function and a method for controlling the same need to have a simple circuit configuration and be a simple control method without increasing the circuit area of the semiconductor device.

SUMMARY

In one embodiment, there is provided a semiconductor device that includes: a command decoder activating a first mode register setting signal in response to a mode register setting command issued from outside; a first latency shifter activating a second mode register setting signal after elapse of predetermined cycles of a clock signal since the first mode register setting signal is activated; and a mode register storing a mode signal supplied from outside in response to the second mode register setting signal.

In another embodiment, there is provided a semiconductor device that includes: a command decoder activating a first mode register setting signal in response to a mode register setting command issued from outside; a latency shifter delaying the first mode register setting signal to generate a second mode register setting signal; a logic gate circuit that activates a third mode register setting signal in response to the second mode register setting signal when a data signal supplied from outside is in a first logic level, and inactivates the third mode register setting signal regardless of the second mode register setting signal when the data signal is in a second logic level; and a mode register storing a mode signal in response to the third mode register setting signal.

In still another embodiment, there is provided a semiconductor device comprising: a first external terminal receiving a command signal; a second external terminal receiving a data signal; a third external terminal receiving an address signal; a command decoder configured to output a mode register setting signal based on the command signal; a latency shifter configured to receive the mode register setting signal and output a shifted mode register setting signal; a logic gate configured to receive the shifted mode register setting signal and a portion of the data signal and output a second mode register setting signal; and a mode register configured to receive the second mode register setting signal and a portion of the address signal.

In still another embodiment, there is provided an information processing system that includes: a plurality of semiconductor devices; and a controller that supplies a mode register setting command and a mode signal to the plurality of semiconductor devices in common, and supplies different data signals to each of the semiconductor devices. Each of the semiconductor devices includes: a command decoder activating a first mode register setting signal in response to the mode register setting command supplied from the controller; a latency shifter delaying the first mode register setting signal to generate a second mode register setting signal; a logic gate circuit that activates a third mode register setting signal in response to the second mode register setting signal when an associated one of the data signals supplied from the controller is in a first logic level, and inactivates the third mode register setting signal regardless of the second mode register setting signal when the associated one of the data signal is in a second logic level; and a mode register storing the mode signal supplied from the controller in response to the third mode register setting signal.

According to the present invention, the PDA function can be implemented by a simple circuit configuration.

BRIEF DESCRIPTION OF THE DRAWINGS

FIG. 2 is an example of a truth table for explaining an operation of a command decoder shown in FIG. 1;

DETAILED DESCRIPTION OF THE EMBODIMENTS

A representative example of the technical concept of an embodiment of the present invention for solving the problem will be described below. It will be understood that what the present invention claims are not limited to such a technical concept but set forth in the claims of the present invention. The technical concept of the present embodiment includes: activating a mode register setting signal based on a mode register setting command issued from a controller; delaying the mode register setting signal as much as a predetermined latency by using a latency shifter; and then rewriting a mode register based on the delayed mode register setting signal. This can provide a latency for the rewriting of the mode register. Whether to enable or disable the mode register setting signal may be specified by supplying a data signal of high level or low level to the semiconductor device in synchronization with a lapse of the latency. Consequently, even if a plurality of semiconductor devices are connected to a single controller in common, set values can be written into the mode registers of the respective semiconductor devices.

Figure 1:
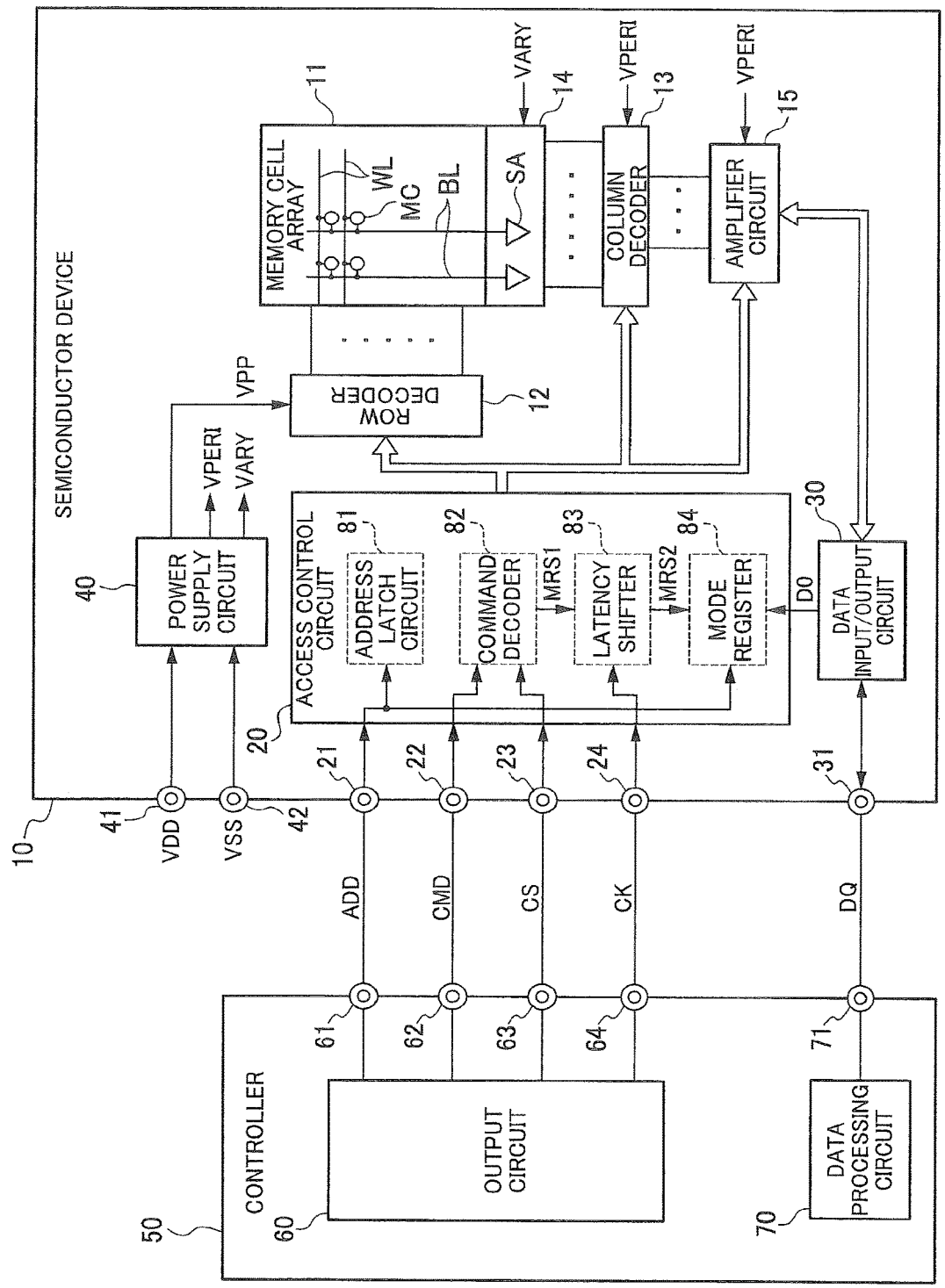
FIG. 1 is a block diagram for explaining the principle of an embodiment.

Referring now to FIG. 1, an information processing system including a controller 50 and a semiconductor device 10 is shown. The semiconductor device 10 shown in FIG. 1 is a semiconductor memory device such as a DRAM. The semiconductor device 10 includes a memory cell array 11. The memory cell array 11 is divided, though not limited to, into a plurality of bank groups. Each bank group is divided into a plurality of banks. The memory cell array 11 includes a plurality of word lines WL and a plurality of bit lines BL which intersect each other. Memory cells MC are arranged at the intersections. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD, a command signal CMD, a chip select signal CS, and a clock signal CK are supplied to the access control circuit 20 through terminals 21 to 24. Based on such signals; the access control circuit 20 controls the row decoder 12, the column decoder 13, the sense circuit 14, the amplifier circuit 15, and a data input/output circuit 30.

Specifically, if the command signal CMD is an active command, the address signal ADD is supplied to the row decoder 12. In response to this, the row decoder 12 selects a word line WL that is designated by the address signal ADD, whereby corresponding memory cells MC are connected to respective bit lines BL. The access control circuit 20 then activates the sense circuit 14 at predetermined timing.

On the other hand, if the command signal CMD is a read command or a write command, the address signal ADD is supplied to the column decoder 13. In response to this, the column decoder 13 connects bit lines BL designated by the address signal ADD to the amplifier circuit 15. Consequently, in a read operation, read data DQ read from the memory cell array 11 through sense amplifiers SA is output from a data terminal 31 to outside through the amplifier circuit 15 and the data input/output circuit 30. In a write operation, write data DQ supplied from outside through the data terminal 31 and the data input/output circuit 30 is written to memory cells MC through the amplifier circuit 15 and sense amplifiers SA.

As shown in FIG. 1, the access control circuit 20 includes an address latch circuit 81, a command decoder 82, a latency shifter 83, and a mode register 84.

The address latch circuit 81 is a circuit that latches the address signal ADD supplied through the address terminal 21. As described above, the address signal ADD latched in the address latch circuit 81 is supplied to the row decoder 21 or the column decoder 13 depending on the content of the command signal CMD.

The command decoder 82 is a circuit that decodes the command signal CMD and the chip select signal CS supplied through the command terminal 22 and the chip select terminal 23. The command signal CMD includes, though not limited to, a plurality of bits of control signals including an active signal ACT, a row address strobe signal RAS, a column address strobe signal CAS, and a write enable signal WE. Access types are defined by the combinations of the logic levels of such signals. Examples of the access types include a row access based on an active command, a read access based on a read command, a write access based on a write command, a rewrite operation on a mode register based on a mode register setting command, and a status quo operation based on a NOP command.

Turning to FIG. 2, in this example, combinations of the chip select signal CS and the command signal CMD produce internal commands including a DESEL command, the NOP command, an active command IACT, a precharge command IPRE, a first write command IWR1, a read command IRD1, and a first mode register setting command MRS1. As employed herein, an active signal 'IACT is a signal that indicates the active command IACT. A first write signal IWR1 is a signal that indicates the first write command IWR1. A read signal IRD1 is a signal that indicates the read command IRD1. A first mode register setting signal MRS1 is a signal that indicates the first mode register setting command MRS1.

The DESEL command is a command that is generated when the chip select signal CS is in an inactive state. When the DESEL command is issued, the access control circuit 20 performs no access operation. The NOP command is a command that is generated when the chip select signal CS is in an active state and all the bits of the command signal CMD are at a low level. Again, when the NOP command is issued, the access control circuit 20 performs no access operation.

When the active command IACT, the first write command IWR1, and the read command IRD1 are issued, the access control circuit 20 performs the foregoing operations to make a row access, a write access, and a read access, respectively. The precharge command IPRE is a command for deactivating the memory cell array 11 which has been activated by the active command IACT. The first mode register setting signal MRS1 is an internal command for rewriting a set value of the mode register 84.

The first mode register setting command MRS1 is supplied to the latency shifter 83. The latency shifter 83 is a circuit that delays the first mode register setting signal MRS1 by a predetermined latency in synchronization with the clock signal CK supplied through the clock terminal 24. The first mode register setting signal MRS1 delayed by the latency shifter 83 is supplied to the mode register 84 as a second mode register setting signal MRS2. In the present embodiment, the latency shifter 83 may be referred to as a "first latency shifter".

The mode register 84 is rewritten with a mode signal supplied from the address terminal 21 at the activation timing of the second mode register setting signal MRS2. Note that the overwrite operation on the mode register 84 is enabled or disabled depending on the logic level of a data signal DO. Specifically, if the data signal DO is at a low level, the overwrite operation on the mode register 84 is enabled. If the data signal DO is at a high level, the overwrite operation on the mode register 84 is disabled. As described above, the second mode register setting signal MRS2 is activated after a lapse of a predetermined latency since the activation of the first mode register setting signal MRS1. The data signal DO is therefore also input after a lapse of a predetermined latency since the issuance of the mode register setting command. The data signal DO refers to a signal that is input from one of data terminals 31 if there are a plurality of data terminals 31.

The foregoing circuit blocks operate with respective predetermined internal voltages as their power supply. The internal power supplies are generated by a power supply circuit 40 shown in FIG. 1. The power supply circuit 40 receives an external potential VDD and a ground potential VSS supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is a voltage that is mainly used in the row decoder 12. The row decoder 12 drives a word line WL that is selected based on the address signal ADD to the VPP level, thereby making the cell transistors included in memory cells MC conducting. The internal voltage VARY is a voltage that is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. The use of the internal voltage VPERI lower than the external voltage VDD as the operating voltage of the peripheral circuits reduces the power consumption of the semiconductor device 10.

Now, the controller 50 includes an output circuit 60 and a data processing circuit 70. The output circuit 60 is a circuit for supplying the address signal ADD, the command signal CMD, the chip select signal CS, and the clock signal CK to the semiconductor device 10 through terminals 61 to 64. The data processing circuit 70 is a circuit that processes read data DQ and write data DQ input/output through a data terminal 71. The controller 50 issues a mode register setting command to the semiconductor device 10, and after a lapse of a predetermined latency, sets the data signal DO to a high level or low level. The data signal DO is a part of the write data DQ. This can specify whether to enable or disable a mode signal that is supplied along with the mode register setting command.

Figure 3:
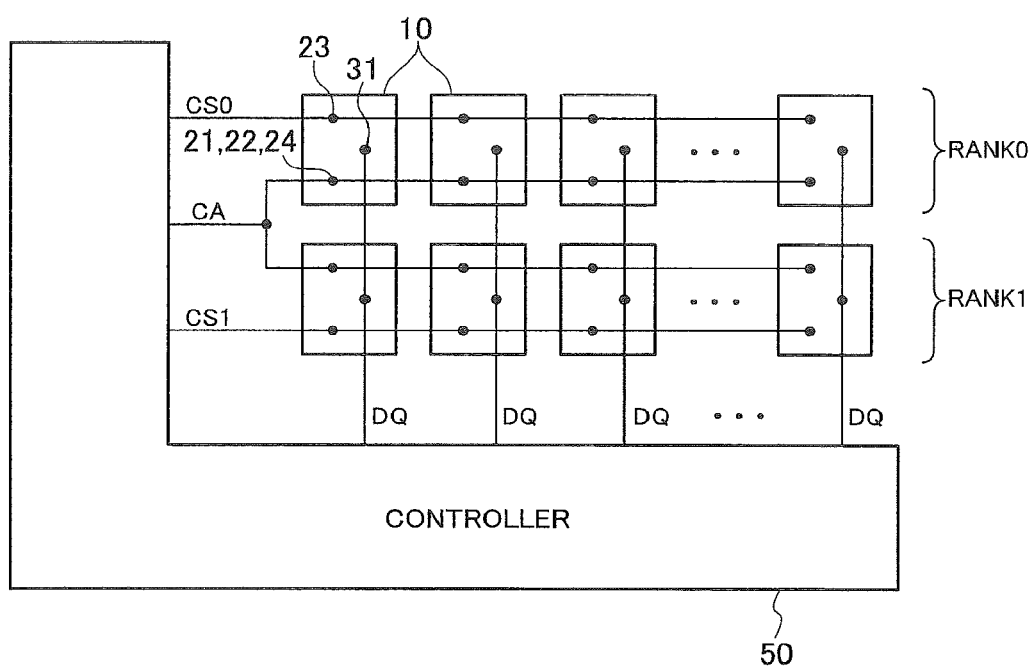
FIG. 3 is a schematic diagram for explaining the connection between a plurality of semiconductor devices 10 and a controller 50.

Turning to the example shown in FIG. 3, the plurality of semiconductor devices 10 are divided into two ranks (RANK0 and RANK1). A chip select signal CS0 is supplied to a plurality of semiconductor devices 10 belonging to RANK0. A chip select signal CS1 is supplied to a plurality of semiconductor devices 10 belonging to RANK1. Either one of the chip select signals CS0 and CS1 can be activated to select one of the ranks. As shown in FIG. 3, the data terminals 31 of the plurality of semiconductor device 10 belonging to the same rank are individually connected to the controller 50. Consequently, read data DQ and write data DQ are transmitted and received between the controller 50 and the plurality of semiconductor devices 10 in parallel. The data terminals 31 of different ranks are connected in common, whereas the transmission and reception of read data DQ or write data DQ will not be simultaneously performed on different ranks.

In the meantime, command and address system signals CA output from the controller 50 are supplied to all the semiconductor devices 10 in common. The command and address system signals CA refer to a group of signals including the address signal ADD, the command signal CMD, and the clock signal CR.

With such a configuration, for example, when the controller 50 issues a mode register setting command, the command becomes valid to all semiconductor devices 10 that belong to a rank selected by the chip select signal CS0 or CS1. In other words, it is not possible to individually issue a mode register setting command to each of a plurality of semiconductor devices 10 belonging to the same rank.

According to the present embodiment, the data signal DO can be used to individually enable a mode register setting operation on each of a plurality of semiconductor devices. 10 belonging to the same rank. As a result, the mode registers 84 in the plurality of semiconductor devices 10 belonging to the same rank can be set to respective different values.

Preferred embodiments of the present invention will be explained below in detail with reference to the accompanying drawings.

Figure 4:
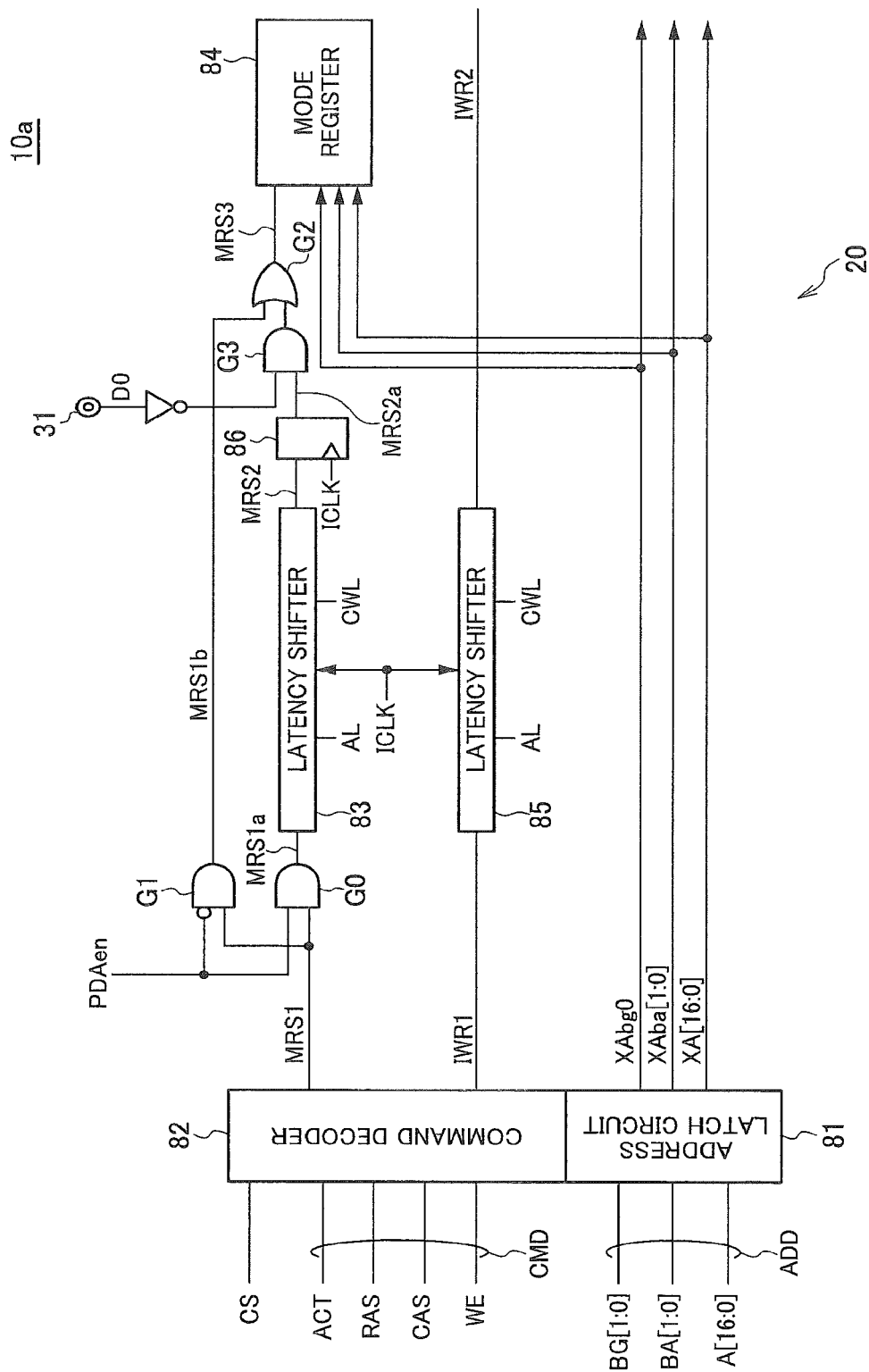
FIG. 4 is a block diagram indicative of an embodiment of a semiconductor device 10 a according to a first preferred embodiment of the present invention and mainly shows details of circuit blocks that belong to a access control circuit 20 shown in FIG. 1.

Turning to FIG. 4, in the first preferred embodiment, the address signal ADD includes bank group signals EGO and BG1, bank address signals BA0 and BA1, and address signals A0 to A16. The bank group signals BG0 and BG1 are signals for selecting any one of four bank groups included in the memory cell array 11. The bank address signals BA0 and BA1 are signals for selecting any one of four banks included in the selected bank group. The address signal A0 to A16 are used as a row address during a row access, and as a column address during a column access. During mode register setting, the address signals A0 to A16 are used as a mode signal.

The command decoder 82 outputs the first write signal IWR1 and the first mode register setting signal MRS1. A latency shifter 85 gives the first write signal IWR1 a predetermined latency before outputting the first write signal IWR1 as a second write signal IWR2. When the second write signal IWR2 is activated, write data DQ is supplied from the controller 50 and the data input/output circuit 30 shown in FIG. 1 takes in the write data DO.

The latency shifter 85 is a circuit that gives a write latency WL to the first write signal IWR1 in synchronization with an internal clock signal ICLK. The internal clock signal ICLK is a synchronization signal synchronous with the clock signal CK supplied from the controller 50. In the present embodiment, the latency shifter 85 may be referred to as a "second latency shifter."

The value of the write latency WL is set to the sum of an additive latency signal AL and a CAS write latency signal OWL which are supplied from the mode register 84. The write latency WL refers to the latency from the issuance of a write command from the controller 50 to the input of the first piece of write data DQ. Issuance timing of a write command may precede its original issuance timing by an additive latency (AL). The write latency WL is thus defined by WL=AL+CWL, where latency from the original issuance timing of the write command to the input of the first piece of write data DO is the CAS write latency (CWL).

The first mode register setting signal MRS1 is supplied to AND gate circuits G0 and G1 in common. The AND gate circuit G0 is a gate circuit that passes the first mode register setting signal MRS1 if an enable signal PDAen is activated to a high level. The AND gate circuit G1 is a gate circuit that passes the first mode register setting signal MRS1 if the enable signal PDAen is deactivated to a low level. In the present embodiment, the AND gate circuits G0 and G1 may be referred to as a "first circuit."

The enable signal PDAen is a signal output from the mode register 84. The enable signal PDAen is activated to a high level when the semiconductor device 10 is set to a PDA mode. The enable signal PDAen is otherwise deactivated to a low level. In the present embodiment, the PDA mode may be referred to as a "first operation mode", and the other cases as a "second operation mode".

A first mode register setting signal MRS1 *a* passed through the AND gate circuit G0 is supplied to the latency shifter 83. The latency shifter 83 is a circuit having the same function as that of the foregoing latency shifter 85. The latency shifter 83 gives a write latency WL to the first mode register setting signal MRS1 *a* in synchronization with the internal clock signal ICLK, and outputs the resultant as a second mode register setting signal MRS2. The value of the write latency WL is set to the sum of the additive latency signal AL and the CAS write latency signal CWL which are supplied from the mode register 84.

The second mode register setting signal MRS2 is supplied to a synchronized delay circuit 86, which provides one clock cycle of delay in synchronization with the internal clock signal ICLK. A second mode register setting signal MRS2 *a* output from the synchronized delay circuit 86 is supplied to one of the input nodes of an AND gate circuit G3. An inverted signal of the data signal DO is supplied to the other input node of the AND gate circuit G3. The output of the AND gate circuit G3 is supplied to one of the input nodes of the OR gate circuit G2. In the present embodiment, the AND gate circuit G3 may be referred to as a "third circuit".

A first mode register setting signal MRS1 *b* output from the AND gate circuit G1 is supplied to the other input node of the OR gate circuit G2. A third mode register setting signal MRS3 output from the OR gate circuit G2 is supplied to the mode register 84. When the third mode register setting signal MRS3 is activated to a high level, a set value of the mode register 84 is rewritten based on the address signal ADD. In the present embodiment, the OR gate circuit G2 may be referred to as a "second circuit".

Figure 5:
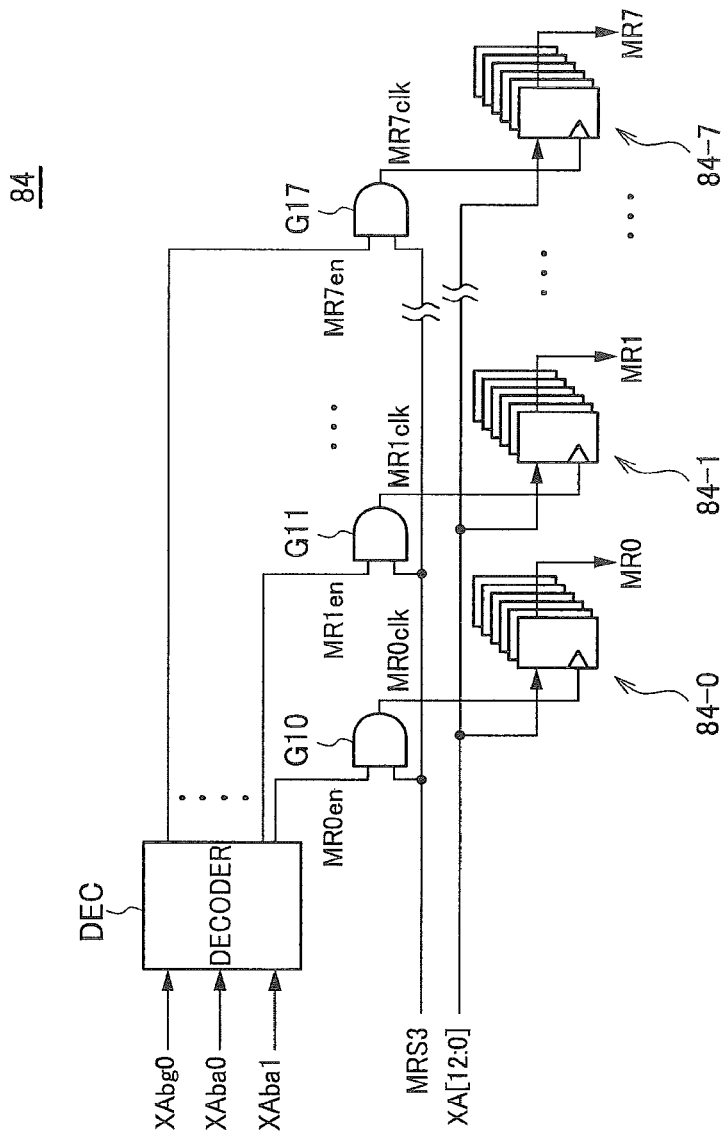
FIG. 5 is a circuit diagram indicative of an embodiment of a mode register shown in FIG. 1.

Turning to FIG. 5, the mode register 84 includes eight register sets 84-0 to 84-7 and a decoder DEC which selects any one of the register sets 84-0 to 84-7. The decoder DEC is a circuit that receives a bank group signal XAbg0 and bank address signals XAba0 and XAba1 which are latched in the address latch circuit 81. Based on the three selection bits, the decoder DEC activates any one of eight bits of select signals MR0 *en* to MR7 *en*. The select signals MR0 *en* to MR7 *en* are supplied to one of the input nodes of respective corresponding AND gate circuits G10 to G17, respectively. The third mode register setting signal MRS3 is supplied to the other input nodes of the AND gate circuits G10 to G17 in common.

The AND gate circuits G10 to G17 output select signals MR0clk to MR7clk, which are supplied to the respective corresponding register sets 84-0 to 84-7. The register sets 84-0 to 84-7 are overwritten with a mode signal using a row address XA0 to XA12 if the respective corresponding select signals MR0clk to MR7clk are activated. Set values MR0 to MR7 set in the register sets 84-0 to 84-7 are supplied to respective predetermined circuit blocks, whereby the operation mode of the semiconductor device 10 is specified.

Figure 6:
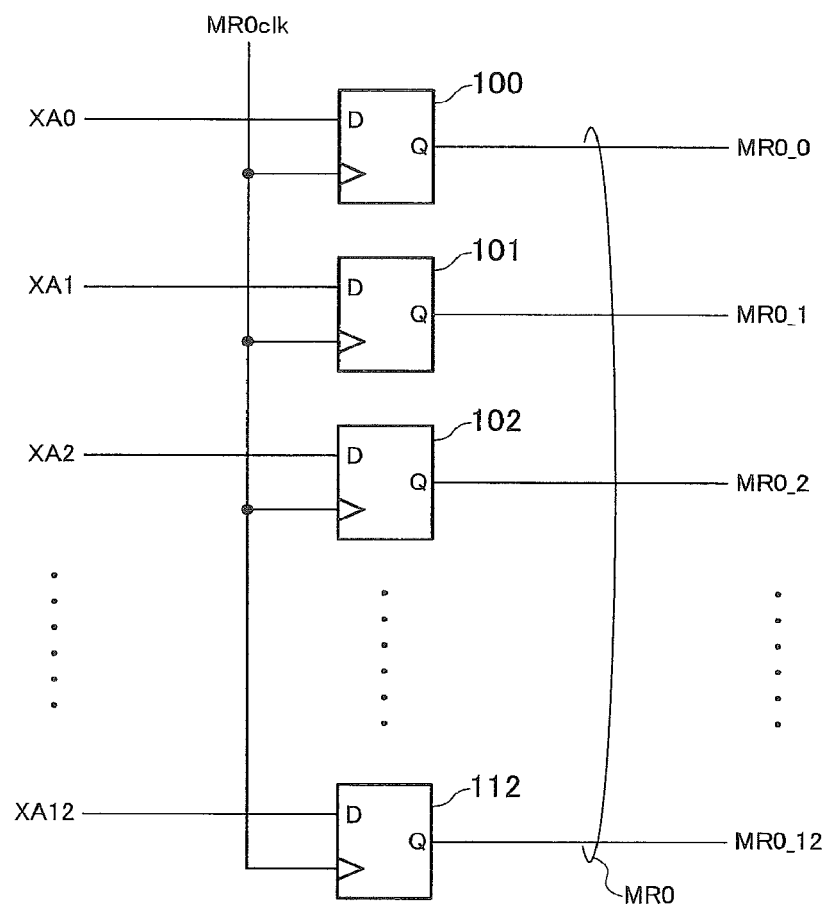
FIG. 6 is a circuit diagram indicative of an embodiment of a register set shown in FIG. 5.

Turning to FIG. 6, the register set 84-0 includes 13 registers 100 to 112. The input nodes D of the registers 100 to 112 are supplied with the respective corresponding bits of the mode signals XA0 to XA12. The select signal MR0clk is supplied to the clock nodes of the registers 100 to 112 in common. With such a configuration, when the select signal MR0clk is activated to a high level, the mode signals XA0 to XA12 are set into the registers 100 to 112. The set values of the registers 100 to 112, or bits MR0_0 to MR0_12, are output as a 13-bit signal that constitutes a set value MR0. The other register sets 84-1 to 84-7 have the same circuit configuration as that of the register set 84-0 shown in FIG. 6 except in that the select signals MR1clk to MR7clk are supplied instead of the select signal MR0clk.

The circuit configuration of the semiconductor device 10 *a* according to the present embodiment has been described so far. Next, the operation of the semiconductor device 10 *a* according to the present embodiment will be described.

Figure 7:
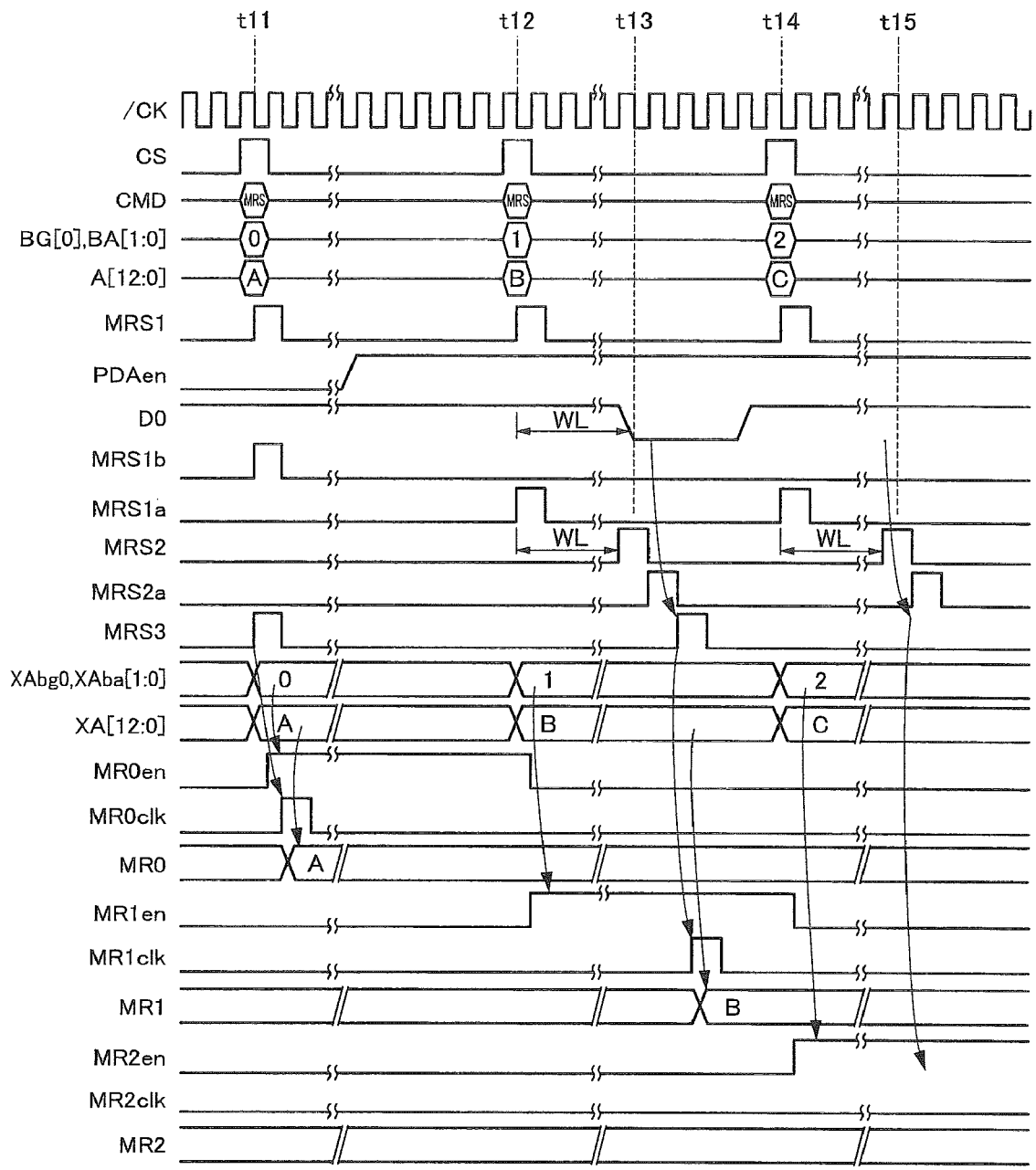
FIG. 7 is a timing chart for explaining the operation of the semiconductor device 10 a according to the present embodiment.

Turning to FIG. 7, in this example, mode register setting commands are issued at times t11, t12, and t14. When a mode register setting command is issued at time t11, the bank group signal BG0 and the bank address signals BA0 and BA1 have a value of 0 (in decimal notation). The address signals A0 to A12 have a value A. When a mode register setting command is issued at time t12, the bank group signal BG0 and the bank address signals BA0 and BA1 have a value of 1 (in decimal notation). The address signals A0 to A12 have a value B. When a mode register setting command is issued at time t14, the bank group signal BG0 and the bank address signals BA0 and BA1 have a value of 2 (in decimal notation). The address signals A0 to A12 have a value C.

When a mode register setting command is issued, the command decoder 82 activates the first mode register setting signal MRS1. At time t11, the enable signal PDAen is at a low level. The first mode register setting signal MRS1 *a* is therefore not activated, and the first mode register setting signal MRS1 *b* is activated. The activation of the first mode register setting signal MRS1 *b* immediately activates the third mode register setting signal MRS3, whereby the designated register set 84-0 is overwritten with the mode signal A.

At time t12, the enable signal PDAen is at a high level, and the first mode register setting signal MRS1 *a* is thus activated. The first mode register setting signal MRS1 *a* is input to the latency shifter 83, and after a lapse of the write latency WL, output as the second mode register setting signal MRS2 (time t13). In the present example, the data signal DO is set to a low level at timing one clock cycle after time t13. As a result, the third mode register setting signal MRS3 is activated, and the designated register set 84-1 is overwritten with the mode signal B.

At time t14, the enable signal PDAen is again at a high level, which activates the first mode register setting signal MRS1 *a*. The first mode register setting signal MRS1 *a* is input to the latency shifter 83, and after a lapse of the write latency WL, output as the second mode register setting signal MRS2 (time t15). In the present example, the data signal DO is at a high level at timing one clock cycle after time t15. Since the third mode register setting signal MRS3 is maintained in an inactive state, the designated register set 84-2 is not overwritten with the mode signal C.

As described above, according to the present embodiment, the PDA function for DDR4 DRAMs to support can be implemented by a simple circuit configuration.

Next, the second preferred embodiment of the present invention will be described.

Figure 8:
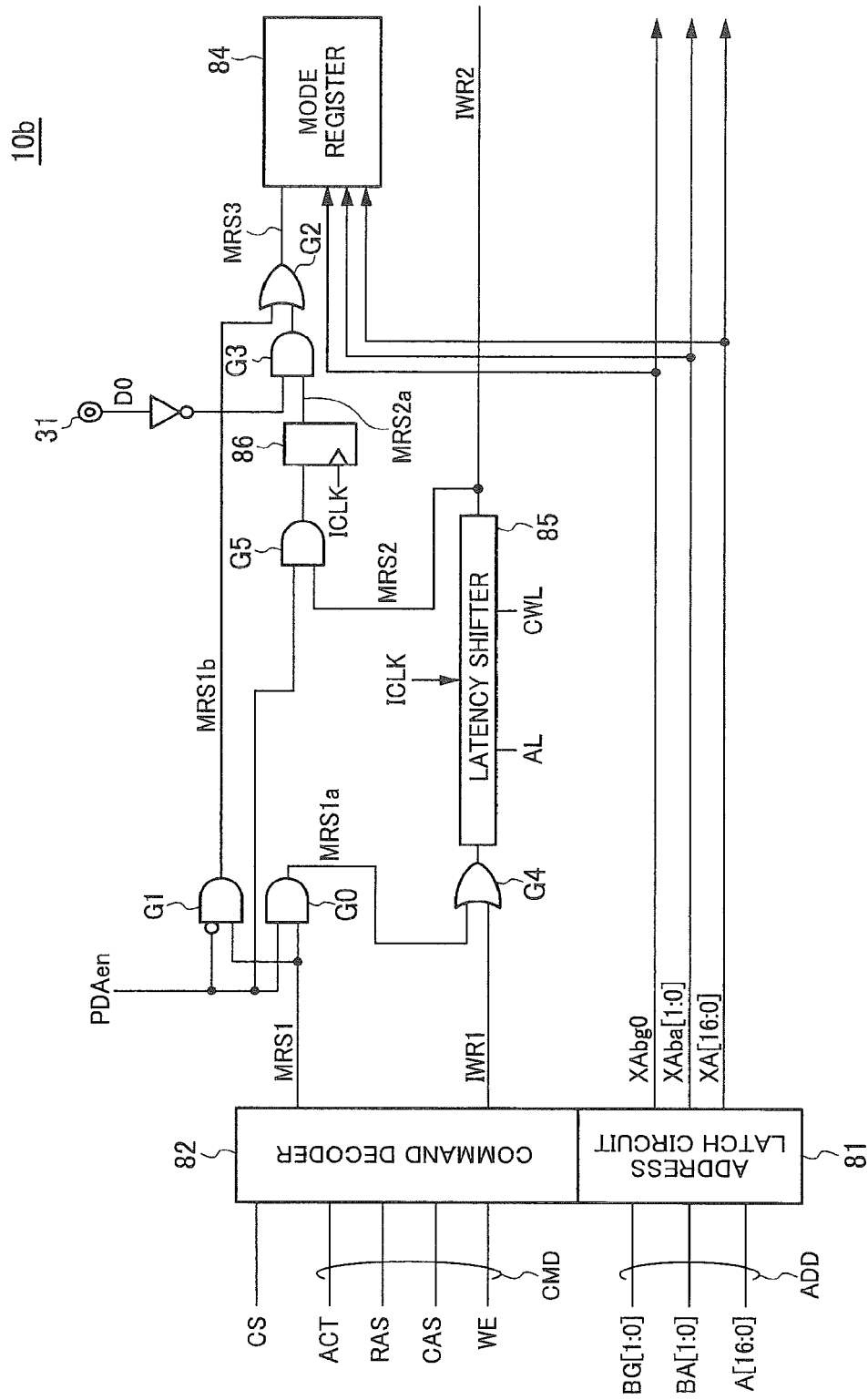
FIG. 8 is a block diagram indicative of an embodiment of a semiconductor device 10 b according to a second preferred embodiment of the present invention and mainly shows details of circuit blocks belonging to the access control circuit 20 shown in FIG. 1.

Turning to FIG. 8, components similar to those of FIG. 4 are designated by the same reference numbers. Redundant description thereof will be omitted.

As shown in FIG. 8, in the present embodiment, the latency shifter 83 is eliminated and its function is implemented by the latency shifter 85 which is for use in a write operation. For that purpose, the first mode register setting signal MRS1 *a* output from the AND gate circuit G0 and the first write signal IWR1 are supplied to an OR gate circuit G4. The output of the OR gate circuit G4 is input to the latency shifter 85. The second mode register setting signal MRS2 and the second write signal IWR2 output from the latency shifter 85 are an identical signal. The first write signal IWR1 is output as the second write signal IWR2 through the latency shifter 85. The first mode register setting signal MRS1 *a* is output as the second mode register setting signal MRS2 through the latency shifter 85. As shown in FIG. 2, the first write command IWR1 and the first mode register setting command MRS1 do not occur at the same time. The latency shifter 85 can thus be shared by the first write command IWR1 and the first mode register setting command MRS1. In the present embodiment, the OR gate circuit G4 may be referred to as a "fourth circuit". The second mode register setting signal MRS2 output from the latency shifter 85 is supplied to one of the input nodes of an AND gate circuit G5. The enable signal PDAen is supplied to the other input node of the AND gate circuit G5. The output of the AND gate circuit G5 is supplied to the synchronized delay circuit 86. In the present embodiment, the AND gate circuit G5 may be referred to as a "fifth circuit". In other respects, the circuit configuration is the same as that of the semiconductor device 10 *a* according to the first embodiment shown in FIG. 4.

According to the present embodiment, the latency shifter 85 for use in a write operation is utilized to delay the first Mode register setting signal MRS1 *a*. A dedicated latency shifter therefore need not be added. This provides the effect of a reduction in chip area in addition to the effects of the first embodiment.

Next, the third preferred embodiment of the present invention will be described.

Figure 9:
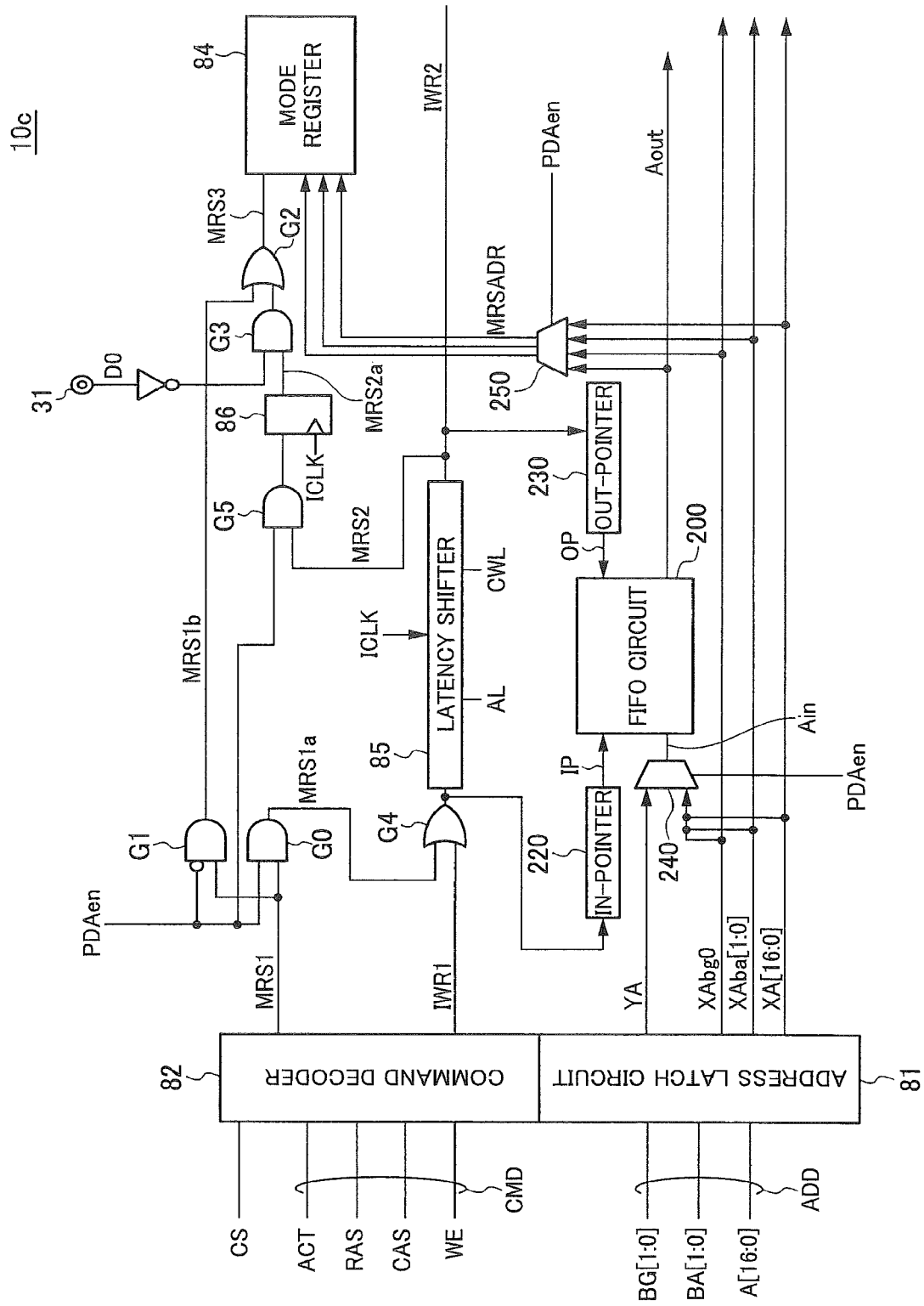
FIG. 9 is a block diagram indicative of an embodiment of a semiconductor device 10 c according to a third preferred embodiment of the present invention and mainly shows details of circuit blocks belonging to the access control circuit 20 shown in FIG. 1.

Turning to FIG. 9, components similar to those of FIG. 8 are designated by the same reference numbers. Redundant description thereof will be omitted.

As shown in FIG. 9, an FIFO circuit 200 for delaying an address signal is added in the present embodiment. The FIFO circuit 200 is a point-shift FIFO circuit using an in-pointer 220 and an out-pointer 230. A selector 240 selects an address signal Ain to be input to the FIFO circuit 200. A column address signal YA, the bank group signal XAbg0 and bank address signals XAba0 and XAba1 (selection bits), and the row address XA0 to XA12 (mode signal) are supplied to the selector 240. The selector 240 selects either the column address signal YA or the others based on the enable signal PDAen. Specifically, if the enable signal PDAen is activated to a high level, the selector 240 selects the selection bits and the mode signal. If the enable signal PDAen is deactivated to a low level, the selector 240 selects the column address signal YA. In the present embodiment, the selector 240 may be referred to as a "sixth circuit".

An address signal Aout output from the FIFO circuit 200, the selection bits, and the mode signal are supplied to a selector 250. If the enable signal PDAen is activated to a high level, the selector 250 selects the address signal Aout. If the enable signal PDAen is deactivated to a low level, the selector 250 selects the selection bits and the mode signal. In the present embodiment, the selector 250 may be referred to as a "seventh circuit".

Consequently, in a FDA mode, the selection bits and the mode signal passed through the FIFO circuit 200 are supplied to the mode register 84. When not in the PDA mode, the selection bits and the mode signal not passed through the FIFO circuit 200 are supplied to the mode register 84. When not in the PDA mode, the FIFO circuit 200 is used to delay the column address signal YA.

Figure 10:
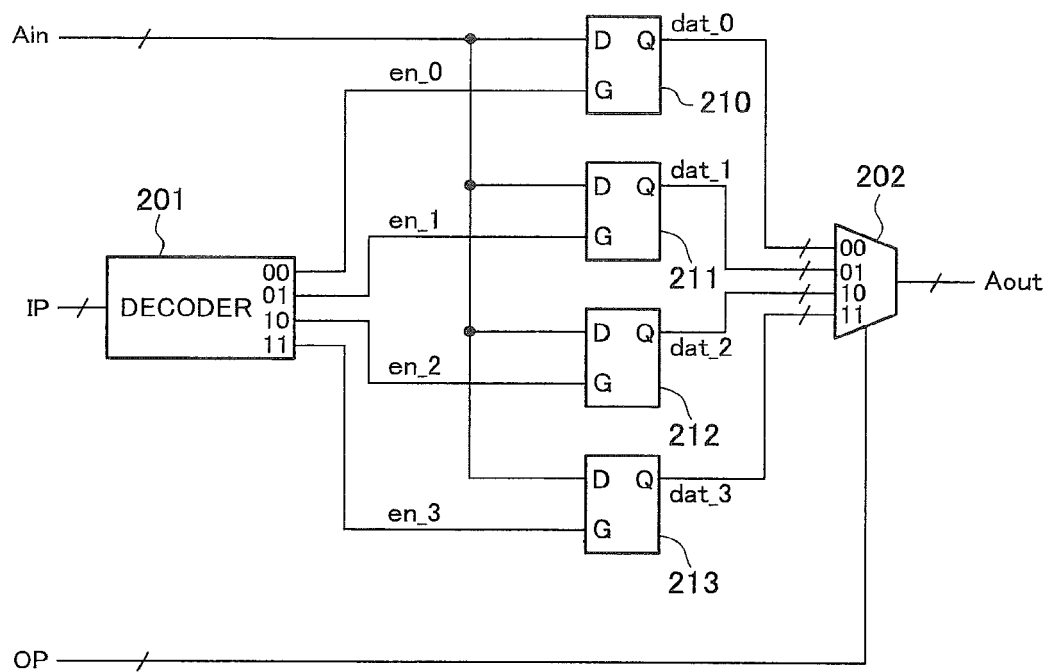
FIG. 10 is a circuit diagram indicative of an embodiment of an FIFO circuit 200.

Turning to FIG. 10, the FIFO circuit 200 includes four latch circuits 210 to 213. The address signal Ain is supplied to the input nodes D of the four latch circuits 210 to 213 in common. The latch circuits 210 to 213 have an enable node G. The enable nodes are supplied with respective corresponding enable signals en_0 to en_3. The enable signals en_0 to en_3 are signals that a decoder 201 generates by decoding a point signal IP which is the output of the in-pointer 220. The in-pointer 220 is a kind of counter circuit whose value is incremented each time the OR gate circuit G4 outputs a command.

Output signals dat_0 to dat_3 output from the output nodes Q of the latch circuits 210 to 213 are selected by a selector 202. The selector 202 makes a selection based on a point signal OP which is the output of the out-pointer 230. The out-pointer 230 is a kind of counter circuit whose value is incremented each time the latency shifter 85 outputs the command IWR2 or MRS2. Any one of the output signals dat_0 to dat_3 selected by the selector 202 is output from the FIFO circuit 200 as the address signal Aout.

Figure 11:
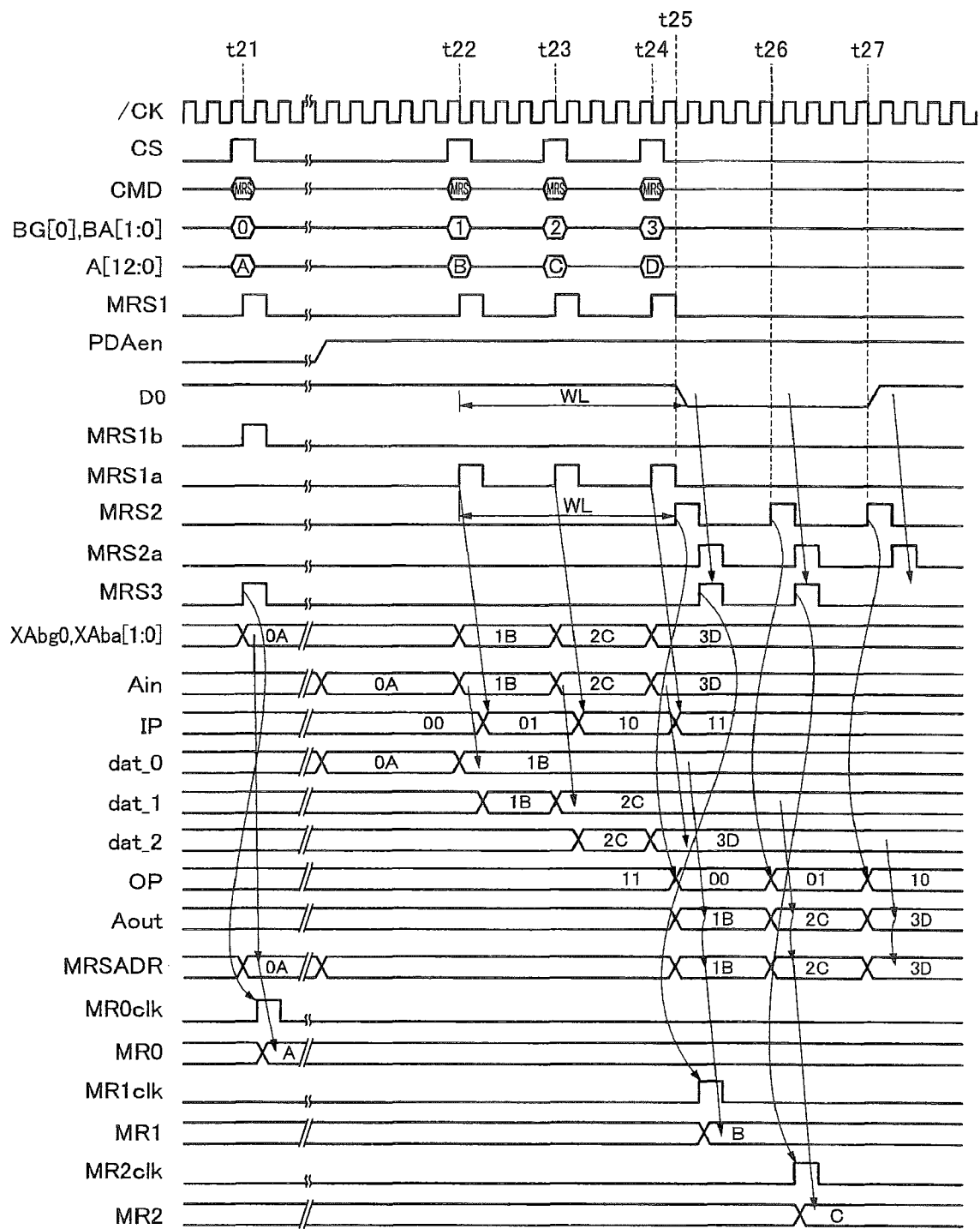
FIG. 11 is a timing chart for explaining the operation of the semiconductor device 10 c according to the third embodiment.

Turning to FIG. 11, in this example, mode register setting commands are issued at times t21, t22, t23, and t24. When a mode register setting command is issued at time t21, the bank group signal BG0 and the bank address signals BA0 and BA1 have a value of 0 (in decimal notation). The address signals A0 to A12 have a value A. When a mode register setting command is issued at time t22, the bank group signal BG0 and the bank address signals BA0 and BA1 have a value of 1 (in decimal notation). The address signals A0 to Alt have a value B. When a mode register setting command is issued at time t23, the bank group signal BG0 and the bank address signals BA0 and BA1 have a value of 2 (in decimal notation). The address signals A0 to A12 have a value C. When a mode register setting command is issued at time t24, the bank group signal BG0 and the bank address signals BA0 and BA1 have a value of 3 (in decimal notation). The address signals A0 to A12 have a value D.

When a mode register setting command is issued, the command decoder 82 activates the first mode register setting signal MRS1. At time t21, the enable signal PDAen is at a low level. The third mode register setting signal MRS3 is thus immediately activated, and the designated register set 84-0 is overwritten with the mode signal A.

On the other hand, at times t22, t23, and t24, the enable signal PDAen is at a high level, which activates the first mode register setting signal MRS1 *a*. The first mode register setting signal MRS1 *a* is input to the latency shifter 83, and after a lapse of the write latency WL, output as the second mode register setting signal MRS2 (times t25, t26, and t27). In the present embodiment, even when the enable signal PDAen is activated to a high level, the controller 50 need not continue supplying the selection bits and the mode signal until the mode signal is actually written into the mode register 84. In the present embodiment, the selection bits and the mode signal are supplied simultaneously with the issuance of a mode register setting command like when issuing a column command. Then, a next mode register setting command can be issued at a minimum submission interval of column commands (tCCD). Consequently, the selection bits and the mode signal may also be supplied at the same time with the issuance of the command.

The selection bits and the mode signal supplied in synchronization with a mode register setting command are delayed by the FIFO circuit 200 as much as the write latency WL. When the second mode register setting signal MRS2 is output from the latency shifter 85, the corresponding selection bits and mode signal are output from the FIFO circuit 200 in synchronization and supplied to the mode register 84.

At timings one clock cycle after times t25 and t26, the data signal DO is set at a low level. The register set 84-1 is thus overwritten with the mode signal B, and the register set 84-2 is overwritten with the mode signal C.

On the other hand, at timing one clock cycle after time t27, the data signal DO is set at a high level. This prevents the designated register set 84-3 from being overwritten with the mode signal D, and the content of the mode register 84 is maintained.

As described above, according to the present embodiment, the FIFO circuit 200 is used to give the selection bits and the mode signal the same delay as that of the mode register setting signal. Mode register setting commands can thus be issued at shorter intervals. Consequently, in addition to the effects of the second embodiment, it is possible to complete mode setting on the plurality of register sets 84-0 to 84-7 in a shorter time. Since the FIFO circuit 200 and the controlling pointers 220 and 230 are circuits for use in a write operation, the circuit scale increases little.

It is apparent that the present invention is not limited to the above embodiments, but may be modified and changed without departing from the scope and spirit of the invention.

Volatile memories, non-volatile memories, or mixtures of them can be applied to the memory cells of the present invention.

The technical concept of the present invention is not limited to a semiconductor device including memory cells, and may be applied to a semiconductor device including a register that retains control information for controlling operation conditions and the like of circuits included in the semiconductor device. The forms of the circuits in the circuit blocks disclosed in the drawings and other circuits for generating the control signals are not limited to the circuit forms disclosed in the embodiments.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors that constitute a logic gate and the like are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following semiconductor devices and information processing systems:

A1. A semiconductor device comprising:
a command decoder activating a first mode register setting signal in response to a mode register setting command issued from outside;
a latency shifter delaying the first mode register setting signal to generate a second mode register setting signal;
a logic gate circuit that activates a third mode register setting signal in response to the second mode register setting signal when a data signal supplied from outside is in a first logic level, and inactivates the third mode register setting signal regardless of the second mode register setting signal when the data signal is in a second logic level; and
a mode register storing a mode signal in response to the third mode register setting signal.

A2. The semiconductor device as described in A1, wherein the data signal is supplied after the mode register setting command is issued.

A3. The semiconductor device as described in A1 or A2, wherein the mode signal is supplied simultaneously with the mode register setting command.

A4. The semiconductor device as described in any one of A1 to A3, wherein the command decoder activates a first write signal in response to a write command issued from outside, and the latency shifter delays the first write signal to generate the second mode register setting signal.

A5. The semiconductor device as described in any one of A1 to A4, further comprising a FIFO circuit that delays the mode signal supplied simultaneously with the mode register setting command, wherein the FIFO circuit supplies the delayed mode signal to the mode register in response to the second mode register setting signal.

A6. An information processing system comprising:

a plurality of semiconductor devices; and a controller that supplies a mode register setting command and a mode signal to the plurality of semiconductor devices in common, and supplies different data signals to each of the semiconductor devices, wherein each of the semiconductor devices comprising:

a command decoder activating a first mode register setting signal in response to the mode register setting command supplied from the controller;

a latency shifter delaying the first mode register setting signal to generate a second mode register setting signal;

a logic gate circuit that activates a third mode register setting signal in response to the second mode register setting signal when an associated one of the data signals supplied from the controller is in a first logic level, and inactivates the third mode register setting signal regardless of the second mode register setting signal when the associated one of the data signal is in a second logic level; and a mode register storing the mode signal supplied from the controller in response to the third mode register setting signal.

A7. The information processing system as described in A6, wherein the controller issues the mode register setting command before supplying the data signals.

A8. The information processing system as described in A6 or A7, wherein the controller supplies the mode signals simultaneously with the mode register setting command.

What is claimed is:

1. A semiconductor device comprising:
    a command decoder activating a first mode register setting signal in response to a mode register setting command issued from outside and a first write signal in response to a write command issued from outside;
    a first latency shifter activating a second mode register setting signal after elapse of a first predetermined number of cycles of a clock signal since the first mode register setting signal is activated;
    a second latency shifter activating a second write signal after elapse of a second predetermined number of cycles of the clock signal since the first write signal is activated;
    a FIFO storing a mode signal supplied from outside in response to the first mode register setting signal; and
    a mode register storing the mode signal stored in the FIFO in response to the second mode register setting signal.

2. The semiconductor device as claimed in claim 1 wherein the FIFO outputs the mode signal stored therein to the mode register in response to the second mode register setting signal.

3. The semiconductor device as claimed in claim 1 wherein the first predetermined number of cycles of the clock signal and the second predetermined number of cycles of the clock signal are equal.

4. The semiconductor device as claimed in claim 1 wherein the first predetermined number of cycles of the clock signal comprises a write latency.

5. The semiconductor device as claimed in claim 4 wherein the first predetermined number of cycles of the clock signal comprises an additive latency.

6. The semiconductor device as claimed in claim 1, further comprising a plurality of address terminals supplied with the mode signal.

7. The semiconductor device as claimed in claim 1, further comprising a plurality of command terminals supplied with a command signal constituted of a plurality of bit signals, the mode register setting command being indicated by a predetermined logical combination of the bit signals.

8. The semiconductor device as claimed in claim 1, further comprising a clock terminal supplied with the clock signal from outside.

9. The semiconductor device as claimed in claim 1, further comprising a data terminal supplied with a data signal from outside, wherein the mode register stores the mode signal in response to the second mode register setting signal and the data signal.

10. The semiconductor device as claimed in claim 1, further comprising:
    a first circuit supplying the first mode register setting signal to the first latency shifter in a first operation mode; and
    a second circuit supplying the second mode register setting signal to the mode register in the first operation mode, and supplying the first mode register setting signal to the mode register in the second operation mode.

11. The semiconductor device as claimed in claim 10, wherein the first circuit does not supply the first mode register setting signal to the first latency shifter in the second operation mode.

12. The semiconductor device as claimed in claim 10, further comprising a data terminal supplied with a data signal from outside, wherein the mode register stores the mode signal in response to the data signal having a first logic level and the mode register does not store the mode signal in response to the data signal having a second logic level.

13. The semiconductor device as claimed in claim 1, wherein the semiconductor device is a memory.

14. The semiconductor device as claimed in claim 1, wherein the semiconductor device is a DRAM.

* * * * *